United States Patent
Won et al.

(10) Patent No.: US 6,750,092 B2
(45) Date of Patent: Jun. 15, 2004

(54) METHODS OF FORMING RUTHENIUM FILM BY CHANGING PROCESS CONDITIONS DURING CHEMICAL VAPOR DEPOSITION AND RUTHENIUM FILMS FORMED THEREBY

(75) Inventors: Seok-jun Won, Seoul (KR); Cha-young Yoo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 09/742,647

(22) Filed: Dec. 21, 2000

(65) Prior Publication Data
US 2001/0006838 A1 Jul. 5, 2001

(30) Foreign Application Priority Data
Dec. 23, 1999 (KR) .......................... 1999-61337
Mar. 10, 2000 (KR) .......................... 2000-12056

(51) Int. Cl.$^7$ .......................................... H01L 21/8242
(52) U.S. Cl. ................. 438/239; 438/253; 438/396; 438/681; 438/686; 427/123; 427/250
(58) Field of Search ................. 438/239, 240, 438/253, 396, 650, 681, 686; 427/99, 252, 255.3, 584, 585, 123, 126.5, 250, 255.31

(56) References Cited

U.S. PATENT DOCUMENTS

| | | | |
|---|---|---|---|
| 5,231,056 A | | 7/1993 | Sandhu .................. 437/200 |
| 5,314,845 A | | 5/1994 | Lee et al. ............... 437/238 |
| 5,372,849 A | * | 12/1994 | McCormick et al. ....... 427/253 |
| 5,834,357 A | * | 11/1998 | Kang ..................... 438/396 |
| 6,063,705 A | * | 5/2000 | Vaartstra ................ 438/681 |
| 6,440,495 B1 | * | 8/2002 | Wade et al. ............. 427/250 |
| 6,479,100 B2 | * | 11/2002 | Jin et al. .............. 427/255.31 |
| 2001/0031527 A1 | * | 10/2001 | Park ..................... 438/239 |
| 2001/0054730 A1 | * | 12/2001 | Kim et al. .............. 257/301 |
| 2002/0055254 A1 | * | 5/2002 | Sano et al. ............. 438/674 |
| 2002/0058415 A1 | * | 5/2002 | Derderian et al. ........ 438/686 |
| 2002/0146513 A1 | * | 10/2002 | Jin et al. .............. 427/255.28 |

* cited by examiner

Primary Examiner—Mary Wllczewski
Assistant Examiner—Toniae M. Thomas
(74) Attorney, Agent, or Firm—Myers Bigel Sibley & Sajovec, P.A.

(57) ABSTRACT

A ruthenium (Ru) film is formed on a substrate as part of a two-stage methodology. During the first stage, the Ru film is formed on the substrate in a manner in which the Ru nucleation rate is greater than the Ru growth rate. During the second stage, the Ru film is formed on the substrate in a manner in which the Ru growth rate is greater than the Ru nucleation rate.

25 Claims, 7 Drawing Sheets

METHODS OF FORMING RUTHENIUM FILM BY CHANGING PROCESS CONDITIONS DURING CHEMICAL VAPOR DEPOSITION AND RUTHENIUM FILMS FORMED THEREBY

RELATED APPLICATION

This application claims the benefit of Korean Patent Application No. 1999-61337, filed Dec. 23, 1999 and Korean Patent Application No. 2000-12056, filed Mar. 10, 2000, the disclosures of which are hereby incorporated herein by reference.

FIELD OF THE INVENTION

The present invention relates generally to chemical vapor deposition (CVD) and, more particularly, to forming ruthenium films by CVD and ruthenium films and integrated circuit devices formed thereby.

BACKGROUND OF THE INVENTION

Noble metals, such as ruthenium (Ru), platinum (Pt), iridium (Ir) and osmium (Os), have traditionally been used infrequently in semiconductor integrated circuits. Recently, however, these noble metals and/or the oxidized substances thereof have been studied for potential use as a lower or upper electrode of a capacitor. This is because the desired electrical characteristics for a capacitor may not be attainable by using polysilicon, which is commonly used as an electrode material when a material, such as $Ta_2O_5$, BST ((Ba, Sr)$TiO_3$) or PZT((Pb, Zr)$TiO_3$), that has a high dielectric constant is used as a dielectric film. Because Ru has a generally good leakage current characteristic and may be etched more easily than Pt, attention has been focused on the use of Ru film as the electrode of a capacitor.

Traditionally, sputtering methods have been used to form Ru films. In accordance with conventional sputtering methods, a Ru film may be densely formed and a generally good surface morphology may be achieved, thereby obtaining a Ru film having a generally good leakage current characteristic and a generally good resistance characteristic. One disadvantage to conventional sputtering methods, however, is that the Ru films formed thereby may provide poor step coverage. As a result, sputtering methods may be less desirable when forming an electrode having a three-dimensional shape, such as a cylinder shape or a fin shape.

CVD has been proposed for forming Ru films because films formed by CVD generally have better step coverage than those formed by sputtering methods. Specifically, in conventional CVD methods, Ru is deposited on a substrate or an interlayer dielectric layer using a vaporized Ru source gas and a reactant gas (i.e., a catalyzer) so that generally good step coverage can be achieved. Unfortunately, the surface morphology of a Ru film formed by CVD is typically worse than that of a Ru film formed by conventional sputtering methods. As a result, it may be difficult to obtain desired leakage current and resistance characteristic using conventional CVD methods. Consequently, there exists a need for improved CVD methods for forming Ru film.

SUMMARY OF THE INVENTION

According to embodiments of the present invention, a ruthenium (Ru) film is formed on a substrate as part of a two-stage methodology. During the first stage, the Ru film is formed on the substrate in a manner in which the Ru nucleation rate is greater than the Ru growth rate. During the second stage, the Ru film is formed on the substrate in a manner in which the Ru growth rate is greater than the Ru nucleation rate. When the Ru film is formed in a manner such that the nucleation rate is greater than the growth rate, the density and uniformity of the Ru grains in the film may be enhanced, which may provide a smooth surface morphology. When the Ru film is formed in a manner such that the growth rate is greater than the nucleation rate, the Ru grains in the film may grow substantially uniformly in various directions, but the nuclei may not be densely formed. As a result, the sheet resistance of the Ru film may be reduced. Moreover, the smooth surface morphology of the Ru film formed during the initial deposition stage may advantageously facilitate the formation of a continuous Ru film in the second deposition stage. Thus, a Ru film formed in accordance with embodiments of the present invention may be viewed as comprising two portions: a first portion having relatively densely formed nuclei having a relatively smooth surface morphology and a second portion having relatively sparsely formed nuclei. The relatively smooth surface morphology of the Ru film formed during the first deposition stage may facilitate the formation of a continuous Ru film during the second deposition stage and the relatively sparsely formed nuclei of the Ru film formed during the second deposition stage may provide for improved electrical characteristics in the form of reduced sheet resistance.

In further embodiments of the present invention, a Ru film is formed on a substrate by chemical vapor deposition (CVD) using a Ru source gas and oxygen as a reactant gas. During the formation of the ruthenium film on the substrate by CVD, one or more of the following process conditions are changed: the CVD chamber pressure, the oxygen gas flow rate, and the substrate temperature. For example, in particular embodiments of the present invention, the CVD chamber pressure may be decreased, the oxygen gas flow rate may be decreased, and/or the substrate temperature may be increased during the deposition of the Ru film. While the CVD chamber pressure and the oxygen gas flow rate are relatively high and the substrate temperature is relatively low, the Ru film may be formed with relatively dense nuclei so that a relatively smooth surface morphology may be achieved. Conversely, while the CVD chamber pressure and/or the oxygen gas flow rate are relatively low and/or the substrate temperature is relatively high, the Ru film may be formed with relatively sparsely formed nuclei for reduced sheet resistance. Thus, by changing any or all of the three process conditions corresponding to the CVD chamber pressure, the oxygen gas flow rate, and the substrate temperature, the physical and electrical characteristics of the Ru film may be varied.

In still further embodiments of the present invention, a two-step methodology may be used to form a Ru film. For example, in a first step, a Ru film may be formed on a substrate by CVD using a Ru source gas and oxygen as a reactant gas at a first CVD chamber pressure and first oxygen gas flow rate. In a second step, the Ru film is formed on the substrate by CVD using the Ru source gas and oxygen as a reactant gas at a second CVD chamber pressure and second oxygen gas flow rate. Importantly, however, either or both of the second CVD chamber pressure and second oxygen flow rate are less than the first CVD chamber pressure and first oxygen flow rate, respectively.

In particular embodiments of the present invention, the first CVD chamber pressure is in a range from about 10 Torr to 50 Torr, the second CVD chamber pressure is in a range from about 0.05 Torr to 10 Torr, the first oxygen flow rate is in a range from about 500 sccm to 2000 sccm, and the second oxygen flow rate is in a range from about 10 sccm to 300 sccm.

In still further embodiments of the present invention, the substrate temperature is in a range from about 250° C. to 450° C. during both steps of the two-step methodology for forming the Ru film. In other embodiments of the present invention, however, the substrate temperature is about 10° C. to 30° C. higher when performing the second step of the two-step methodology than it is when performing the first step of the two-step methodology.

In yet further embodiments of the present invention, the Ru film may be heat treated at about 250° C. to 450° C. in an atmosphere comprising oxygen or ozone after the first step of the two-step methodology and/or after completing both steps of the two-step methodology.

In other embodiments of the present invention, integrated circuit devices, such as capacitors, may be formed by forming a lower and/or an upper electrode as a Ru film as described in the foregoing.

Thus, in summary, the present invention may be used to form Ru films by changing at least one process condition during the CVD methodology. As a result, Ru films having improved continuity and reduced sheet resistance may be obtained.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
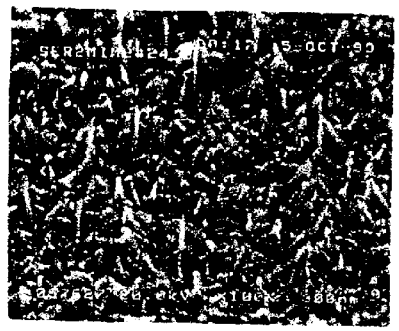
FIGS. 1–3 are photographs taken by a scanning electronic microscope (SEM) of the surfaces of ruthenium (Ru) films formed by chemical vapor deposition (CVD) under various process conditions.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. In the drawings, the thickness of layers and regions are exaggerated for clarity. Like numbers refer to like elements throughout the description of the figures. It will also be understood that when an element, such as a layer, region, or substrate, is referred to as being "on" another element, it can be directly on the other element or intervening elements may also be present. Conversely, when an element is indicated as being "directly on" another element, there are no intervening elements present.

When forming a ruthenium (Ru) film by chemical vapor deposition (CVD), a substrate is typically loaded into the CVD chamber and a Ru source gas and a reactant gas are supplied to the chamber. Examples of a suitable Ru source gas include $Ru(C_2H_5C_5H_4)_2$ (Bis(EthylCyclopentadienyl) Ruthenium (hereinafter $Ru(EtCp)_2$)), $Ru(CH_3CH_2CH_2CH_2C(O)CH+C(O—)CH_3)_3$ (Tris(2, 4-OctaneDionato) Ruthenium), which is liquid at room temperature, $Ru(C_{11}H_{19}O_2)_3$ (Tris(DiPivaloylMetanate) Ruthenium), and $Ru(C_5H_5)_2$ (Bis(Cyclopentadienyl) Ruthenium), which is solid at room temperature. A solid source may be melted and vaporized to generate the source gas. A liquid source may be directly vaporized to generate the source gas. Oxygen gas may be used as a reactant gas (i.e, a catalyzer) for separating Ru atoms from the Ru source gas and depositing them on a substrate. During deposition, an inert gas such as argon or nitrogen, may be used as a carrier gas for smoothly supplying the Ru source gas or reactant gas and as a purge gas for purging the deposition chamber.

Typically, a Ru film is chemical vapor deposited for several minutes at a chamber pressure of several Torr through dozens of Torr, with an oxygen flow rate of dozens of sccm (standard cubic centimeter per minute) through several thousand sccm, and at a substrate temperature of 250°–450° C. In conventional CVD methods, a Ru film is typically deposited under constant process conditions. In accordance with embodiments of the present invention, however, Ru films are formed by changing the process conditions during the CVD procedure.

Figure 2:
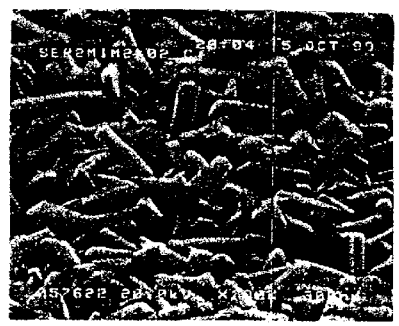

Before describing methods of forming Ru films in accordance with embodiments of the present invention, it may be helpful to examine the characteristics of Ru films formed by CVD methods under fixed process conditions. In general, when a Ru film is formed by CVD, the surface morphology, which may influence electrical characteristics, such as leakage current and resistance, may vary depending on the process conditions. Under certain process conditions, a Ru film may be formed such that the Ru grains grow in a disorderly fashion so as to form "needles" (hereinafter referred to as a needle-shape Ru film) as shown in FIG. 1. Under other process conditions, a Ru film may be formed such that the Ru grains grow in a disorderly fashion so as to form "plates" (hereinafter referred to as a plate-shape Ru film) as shown in FIG. 2. Under still other process conditions, a Ru film may be formed such that the Ru grains grow in a sparse fashion so as to form bulky "rocks" (hereinafter referred to as a rock-shape Ru film) as shown in FIG. 3.

Figure 3:

The CVD conditions for forming the Ru films shown in FIGS. 1 through 3 are as follows:

Ru film of FIG. 1—Substrate temperature: 350° C., Pressure: 19 Torr, Oxygen flow rate: 750 sccm;

Ru film of FIG. 2—Substrate temperature: 350° C., Pressure: 1 Torr, Oxygen flow rate: 750 sccm; and Ru film of FIG. 3—Substrate temperature: 350° C., Pressure: 1 Torr, Oxygen flow rate: 150 sccm.

Figure 4:
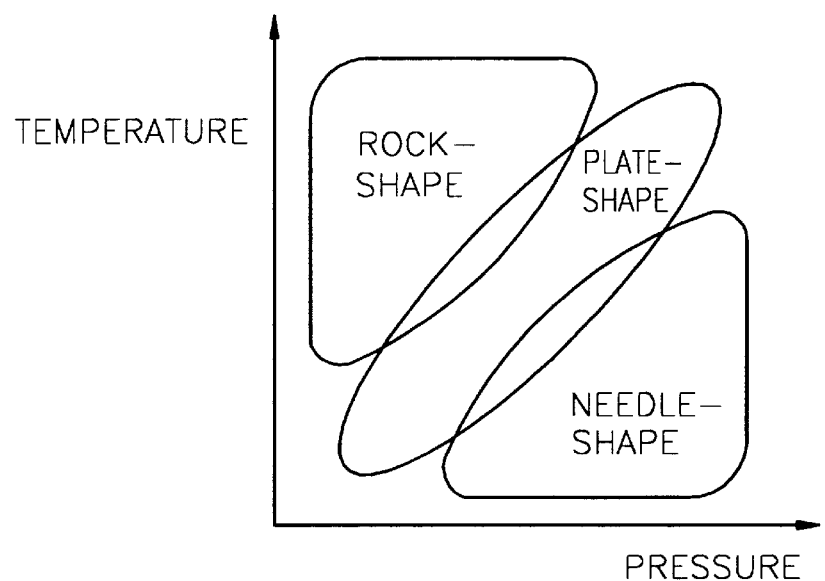
FIG. 4 is a graph that illustrates the morphological distribution of Ru films, which are formed by CVD at different chamber pressures and substrate temperatures.
Figure 5:
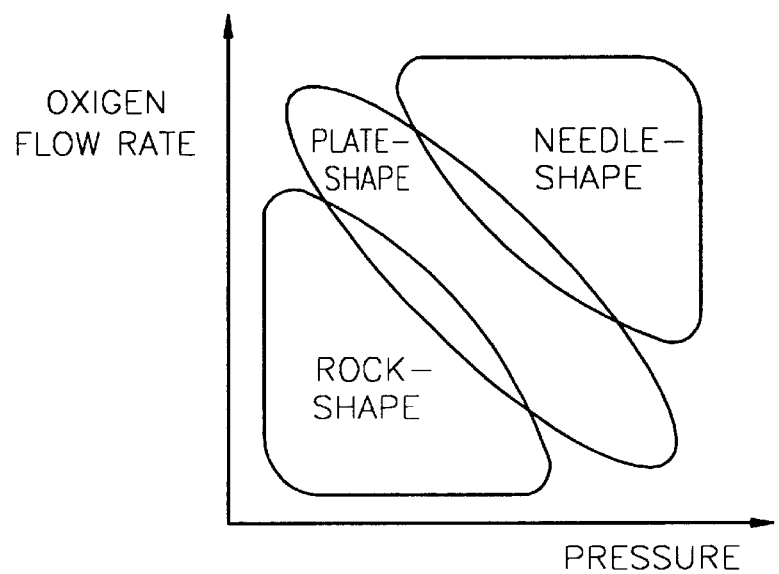
FIG. 5 is a graph that illustrates the morphological distribution of Ru films, which are formed by CVD at different chamber pressures and oxygen flow rates.

Further experimentation in depositing Ru films under various CVD process conditions has revealed the following tendencies: A needle-shape Ru film, as shown in FIG. 1, may generally be obtained at a low substrate temperature, at a high chamber pressure, and with a high oxygen flow rate; a rock-shape Ru film, as shown in FIG. 3, may generally be obtained at a high substrate temperature, at a low chamber pressure, and with a low oxygen flow rate; and a plate-shape Ru film, as shown in FIG. 2, may generally be obtained under process conditions that are between the conditions associated with the needle-shape Ru film and the rock-shape Ru film. As shown in FIGS. 4 and 5, the morphology of a Ru film varies depending on the substrate temperature, the chamber pressure, and the oxygen flow rate. Typical characteristics of needle, plate, and rock-shape Ru films based on morphology are discussed hereafter.

A needle-shape Ru film results from grains growing rapidly in one direction and slowly in other directions. In a needle-shape Ru film, nuclei are densely formed, but the surface morphology is generally poor (i.e., the surface is rough). As a result, the sheet resistance is generally high and leakage current may increase when the Ru film is used, for example, as the lower electrode of a capacitor. A rock-shape Ru film is characterized by grains that grow uniformly in multiple directions, but the nuclei are generally not densely formed. Accordingly, when a thick rock-shape Ru film is deposited, the surface morphology may be better than that of a needle-shape Ru film, which may result in a lower sheet resistance. When a rock-shape Ru film is thinly deposited, however, an underlayer may be exposed due to the sparsely formed nuclei. Consequently, it may be difficult to deposit a thin rock-shape Ru film. The characteristics of a plate-shape Ru film generally lie between the characteristics of the needle-shape Ru film and the rock-shape Ru film.

When a Ru film is used as a capacitor electrode having a three-dimensional shape, such as a cylinder shape, in a semiconductor device having a high integration density, it is generally desirable to uniformly deposit a thin film (e.g., a thickness of less than 1000 Å) that has a good step coverage and excellent electrical characteristics. Accordingly, in view of the foregoing discussion, it may be difficult to use a needle-shape Ru film or a rock-shape Ru film as a capacitor electrode. Although a plate-shape Ru film, which is a compromise between the needle-shape Ru film and the rock-shape Ru film, may be used, every desired characteristic may not be satisfied.

Figure 6:
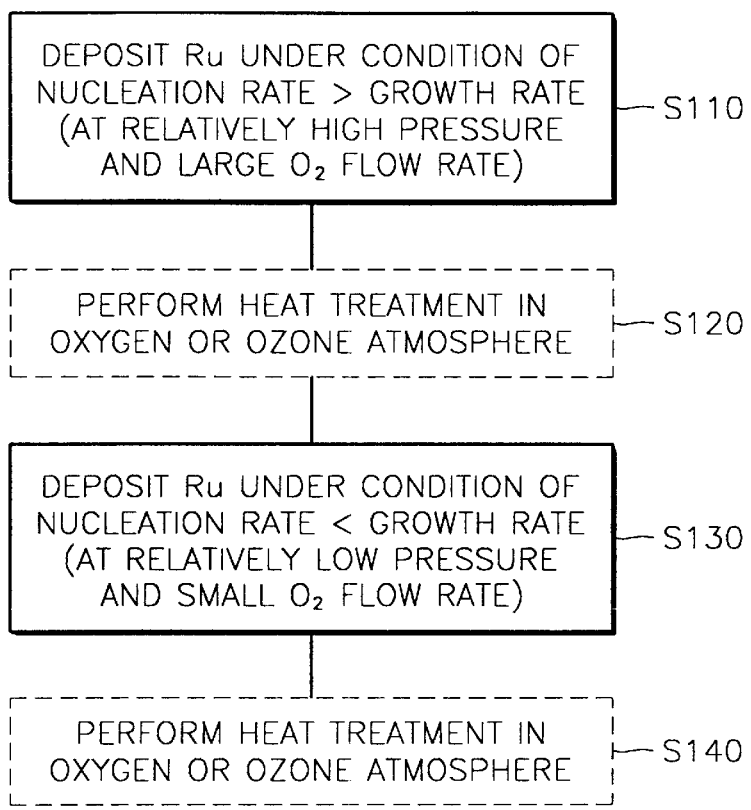
FIG. 6 is a flowchart that illustrates methods of forming ruthenium films by changing process conditions during CVD in accordance with embodiments of the present invention.

In accordance with embodiments of the present invention, Ru films having both good continuity and good surface morphology may be obtained by changing one or more CVD process conditions during the Ru deposition procedure. Referring now to FIG. 6, in an initial deposition phase or stage, Ru is deposited at block S110 under conditions that facilitate a nucleation rate that is faster than the growth rate (i.e., under conditions that produce a needle-shape film) to form dense and uniform Ru grains. At block S130, Ru is deposited under conditions that facilitate a growth rate that is faster than a nucleation rate (i.e., under conditions that produce a rock-shape film) to uniformly grow the Ru grains. Note that in the second deposition stage, the Ru film that is formed is not a conventional rock-shaped film as described hereinabove, but is instead a particular shaped Ru film that is formed based on the condition that an underlying layer thereof is an Ru film formed under conditions that facilitate a nucleation rate that is faster than the growth rate.

In particular embodiments of the present invention, during the initial deposition phase or stage, Ru is deposited for about 5 seconds to 5 minutes while a chamber pressure is maintained at about 10–50 Torr (preferably 20–40 Torr) and an oxygen flow rate is maintained at about 500–2000 sccm (preferably 1000–1500 sccm). During a second or later deposition phase or stage, Ru is deposited until a Ru film of a desired thickness is obtained while the chamber pressure is maintained at about 0.05–10 Torr (preferably 0.1–3 Torr) and the oxygen flow rate is maintained at about 10–300 sccm (preferably 50–150 sccm). For example, when vaporized $Ru(EtCp)_2$ is used as a Ru source gas, a 100% undiluted solution of $Ru(EtCp)_2$ may be supplied to the chamber at a flow rate of 0.01–0.3 ccm. Alternatively, $Ru(EtCp)_2$ may be mixed with a solvent such as tetrahydrofuran (THF) and supplied to the chamber at a flow rate of more than 0.01–0.3 ccm. A substrate temperature may be maintained substantially constant throughout the CVD procedure at about 250°–450° C. (preferably 300°–350° C.). Alternatively, the substrate temperature may be lower during the initial deposition phase or stage and higher during the second or later deposition phase or stage. When the substrate temperature is changed during the CVD procedure, the difference between the temperatures in the two phases or stages is preferably 10°–30° C. In accordance with embodiments of the present invention, the substrate temperature may be changed discretely (e.g., in one or more steps) or continuously. Similarly, the chamber pressure and oxygen flow rate may also be changed discretely or continuously.

As described above, at least two CVD process conditions, such as the chamber pressure and the oxygen flow rate, are simultaneously changed during the CVD procedure. In accordance with further embodiments of the present invention, only one among the three CVD process conditions of chamber pressure, oxygen flow rate, and substrate temperature may be changed to adjust the relative difference between nucleation rate and growth rate for the Ru film. By changing one of the aforementioned CVD process conditions, the combined conditions may be converted from conditions that facilitate the formation of a needle-shape Ru film into conditions that facilitate the formation of a rock-shape Ru film and vice versa. In other words, conditions under which a needle-shape Ru film is formed may be established in an initial phase or stage and then conditions under which a rock-shape Ru film is formed may be established in a later phase or stage by changing only one of the three CVD process conditions of chamber pressure, oxygen flow rate, and substrate temperature and fixing the remaining two conditions as shown in FIGS. 4 and 5. The Ru film that is formed in the second deposition stage is not a conventional rock-shaped film as described hereinabove, but is instead a particular shaped Ru film that is formed based on the condition that an underlying layer thereof is an Ru film formed under conditions that facilitate a nucleation rate that is faster than the growth rate. From a productivity standpoint, it is generally preferable to change either or both of the chamber pressure and the oxygen flow rate rather than the substrate temperature because it generally takes longer to obtain the desired temperature.

Figure 7:
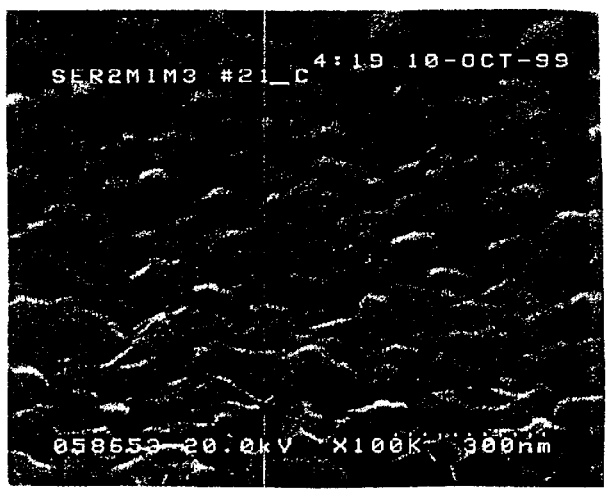
FIG. 7 is a photograph taken by a SEM of a surface of a Ru film formed in accordance with embodiments of the present invention.

FIG. 7 is a photograph taken by a scanning electron microscope (SEM) of a surface of a Ru film formed in accordance with embodiments of the present invention. The Ru film of FIG. 7 is obtained by depositing Ru in a two-step CVD process with changes in the chamber pressure and the oxygen flow rate. In a first step, Ru is deposited for about one minute while the chamber pressure is maintained at about 19 Torr and the oxygen flow rate is maintained at about 750 sccm. In a second step, Ru is deposited for about one minute while the chamber pressure is maintained at about 5 Torr and the oxygen flow rate is maintained at about 100 sccm. During the two steps, the substrate temperature is maintained at about 350° C.

Referring to FIG. 7, the resulting Ru film is similar to the rock-shape Ru film of FIG. 3, but its surface is generally smoother and its grains are more densely formed as compared to the Ru film of FIG. 3 (note that the photograph of FIG. 7 has been enlarged about 1.5 times the enlargement applied in FIGS. 1–3). Thus, according to embodiments of the present invention, a thin seed layer of Ru film characterized by dense nucleation may be formed in the first step. In the second step, the Ru film may grow substantially uniformly in multiple directions centering around seeds on the thin seed layer so that Ru film grows into a rock-shape or columnar shape, which is generally more dense than the rock-shape Ru film of FIG. 3. The thin seed layer portion of the Ru film may provide a relatively smooth surface morphology, which may facilitate the formation of a continuous Ru film during the second deposition step. In addition, the second portion of the Ru film may provide improved electrical characteristics in the form of reduced sheet resistance.

Figure 8:
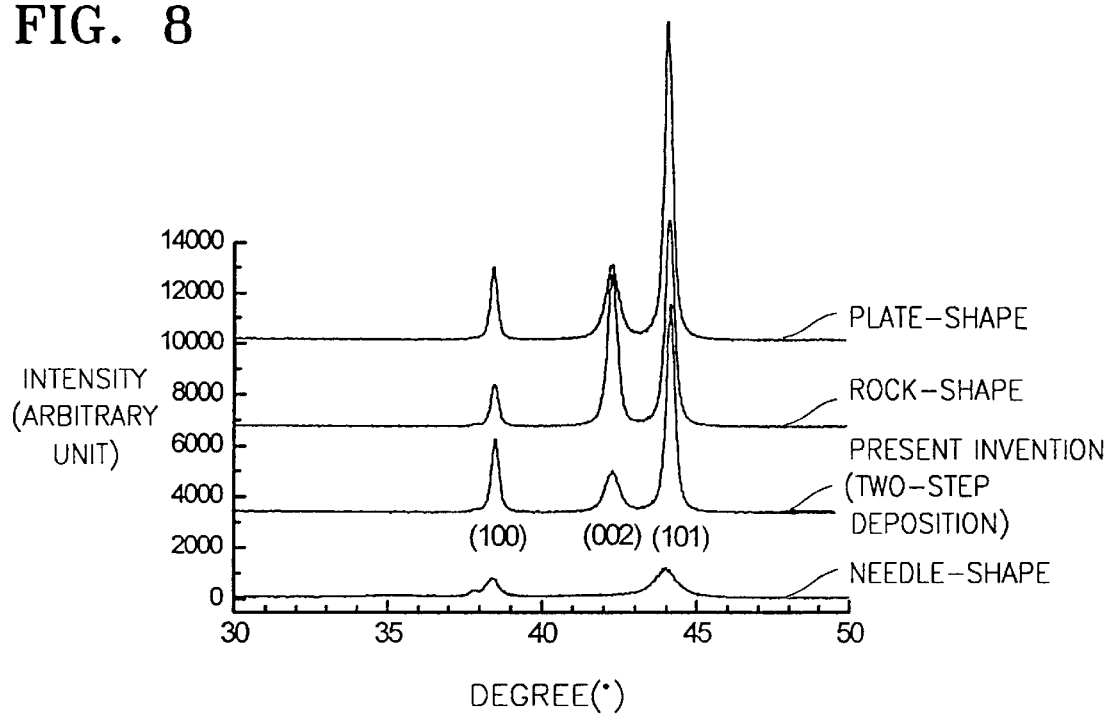
FIG. 8 is a graph that illustrates the results of an X-ray diffraction analysis of Ru films formed by CVD under various process conditions.

The characteristics of Ru films formed in accordance with embodiments of the present invention in which process conditions are changed during the CVD will be compared with the characteristics of conventional needle, plate, and rock-shape Ru films. FIG. 8 is a graph that illustrates results of an X-ray diffraction analysis of Ru films formed by CVD under various environmental conditions. As shown in FIG. 8, in the case of a needle-shape Ru film sample, the overall peak intensity is generally low and the grains do not grow in a (002) direction, which is generally the densest surface of a Ru film having a hexagonal close-packed structure. In the case of a rock-shape Ru film sample, the particles grow in the (002) direction generally more than in the other samples. A Ru film sample formed in a two-step CVD deposition according to embodiments of the present invention shows similar characteristics to those of a sample plate-shape Ru film. It appears, therefore, that the growth pattern of Ru particles is substantially the same in both a plate-shape Ru film and an Ru film formed through a two-step CVD process, according to embodiments of the present invention, in which the deposition conditions are selected so as to cause the nucleation rate to be faster than the growth rate during an initial deposition stage and the growth rate is faster than the nucleation rate during a second deposition stage. Inasmuch as dense nucleation may be achieved in the initial step, the morphology of the Ru film sample formed according to embodiments of the present invention is generally good.

Figure 9:
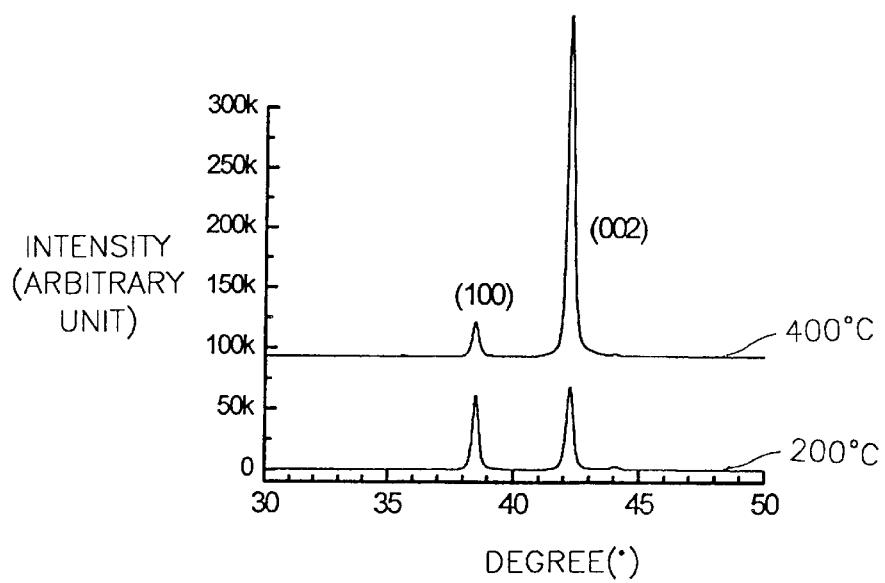
FIG. 9 is a graph that illustrates the results of an X-ray diffraction analysis of Ru films formed by sputtering.

Referring now to FIG. 9, a graph is shown that illustrates the results of an X-ray diffraction analysis of Ru films formed by sputtering. A main peak in the (101) direction does not appear as it does in the Ru films formed by CVD as shown in FIG. 8. A peak does appear in the (002) direction, which is towards the densest surface, particularly at high temperature (e.g., 400° C.). Based on these data, it appears that the Ru grains grow in a direction that is characterized by high density due to the nature of sputtering at high temperature (i.e., physical collisions between atoms and the substrate).

Figure 10:
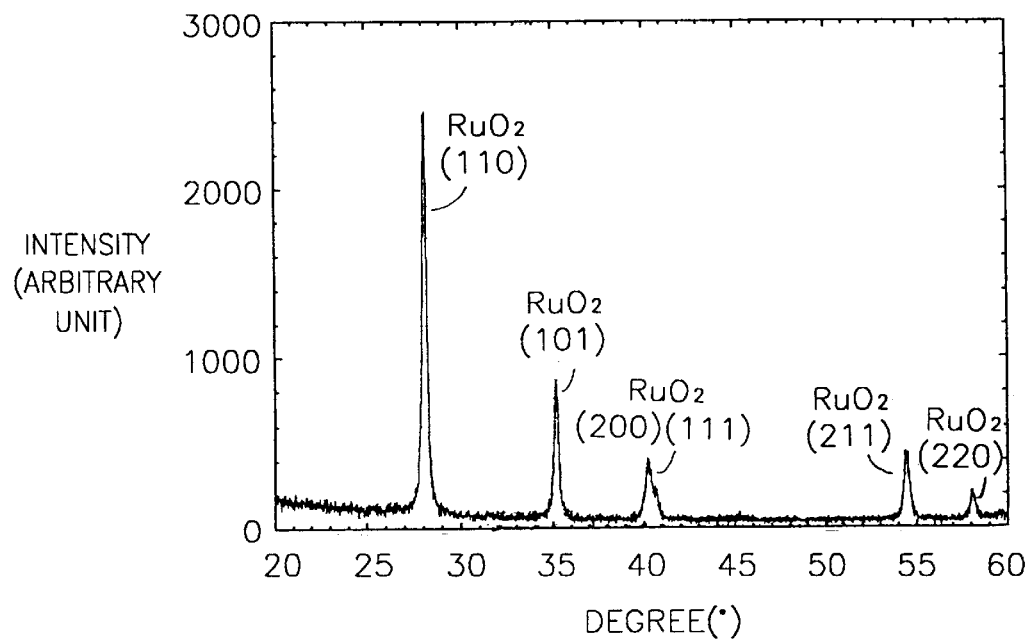
FIG. 10 is a graph that illustrates the results of an X-ray diffraction analysis of a Ru oxide film formed by CVD.

FIG. 10 is a graph that illustrates the results of an X-ray diffraction analysis of a ruthenium oxide ($RuO_2$) film formed by CVD. The positions of the peaks of the ruthenium oxide film shown in FIG. 10 are clearly different from the positions of the peaks of the Ru film, which is formed according to embodiments of the present invention, and is shown in FIG. 8. Thus, the Ru films formed by CVD according to embodiments of the present invention do not have the phase of a ruthenium oxide film even though they contain oxygen as an impurity.

Figure 11:
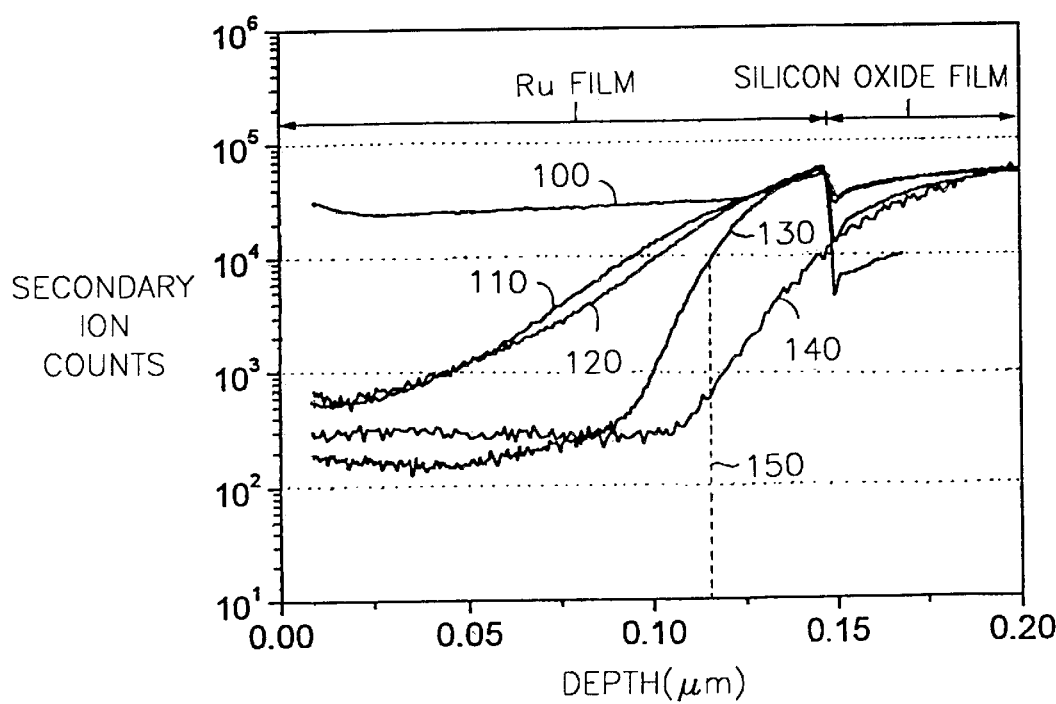
FIG. 11 is a graph that illustrates the results of an oxygen concentration analysis in Ru films formed by CVD under various process conditions and by sputtering by using a secondary ion mass spectrometer.

FIG. 11 is a graph that illustrates the results of an oxygen concentration analysis in Ru films formed on a silicon oxide film by sputtering and by CVD under various process conditions, including changing process conditions, by using a secondary ion mass spectrometer (SIMS). In FIG. 11, the horizontal axis denotes the depth of a Ru film, and the vertical axis denotes the counted number of secondary ions separated from a Ru film. Reference numeral 100 denotes a needle-shape Ru film, reference numeral 110 denotes a rock-shape Ru film, reference numeral 120 denotes a plate-shape Ru film, reference numeral 130 denotes a Ru film formed by a two-step CVD methodology according to embodiments of the present invention, and reference numeral 140 denotes a Ru film deposited by sputtering.

Referring now to FIG. 11, because the needle-shape Ru film 100 is deposited at a high chamber pressure and with a large oxygen flow rate, its oxygen concentration profile is highest and is generally constant. For the rock-shape Ru film 110 and the plate-shape Ru film 120, the oxygen concentration profile slowly and continuously increases as depth increases. For the Ru film 130 formed by the two-step CVD according to embodiments of the present invention, the oxygen concentration profile is low and generally constant down to a predetermined depth from the surface at which point it rapidly increases. This is because, as described above, the oxygen flow rate is larger during the first step of the deposition and smaller during the second step of the deposition according to embodiments of the present invention. For the Ru film 140 formed by a sputtering method, an oxygen concentration profile is low and generally constant down to a predetermined depth from the surface at which point it slowly increases.

It is assumed, however, that the Ru film formed by sputtering has a low and substantially constant oxygen concentration profile due to the small amount of oxygen included in the atmosphere within the sputtering chamber. It appears, therefore, that the increase in the oxygen concentration profile of the Ru film 140 of FIG. 11 once a predetermined depth is reached may be caused by oxygen contained in a silicon oxide film, which is an underlayer of the Ru film, being separated and counted. Accordingly, it appears that the increase in the oxygen concentration profile of the Ru film 140 may be caused by an error in the SIMS analysis. Taking this SIMS analysis error into account, the oxygen concentration profile of the Ru film 130, which is formed by a two-step CVD methodology in accordance with embodiments of the present invention, may slope more sharply at the dashed line 150, substantially approximating a step function. The dashed line 150 indicates the boundary between a Ru film portion deposited in a first step and a Ru film portion deposited in a second step during a two-step deposition according to embodiments of the present invention.

Figure 12:
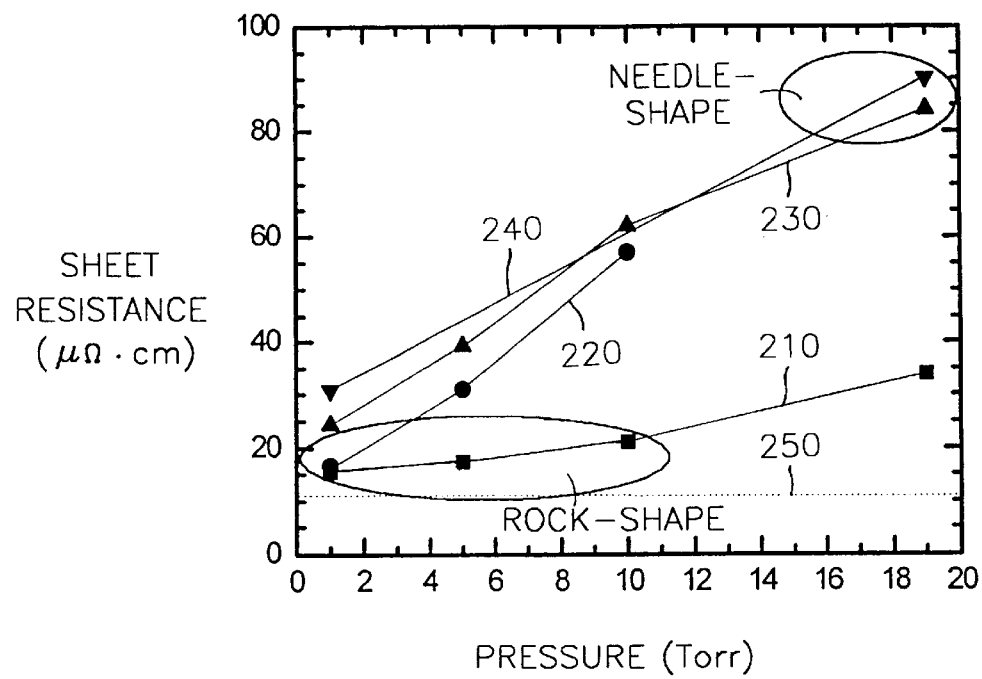
FIG. 12 is a graph that illustrates the measured sheet resistance in Ru films formed by CVD under various process conditions.

FIG. 12 is a graph that illustrates the measured sheet resistance in Ru films formed by CVD under various process conditions. More specifically, the reference numerals denote Ru films having different sheet resistances based on different oxygen flow rates. Reference numeral 210 denotes a Ru film formed with an oxygen flow rate of 150 sccm. Reference numeral 220 denotes a Ru film formed with an oxygen flow rate of 350 sccm. Reference numeral 230 denotes a Ru film formed with an oxygen flow rate of 750 sccm. Reference numeral 240 denotes a Ru film formed with an oxygen flow rate of 1500 sccm. Reference numeral 250 denotes a bulk Ru film. As shown in FIG. 12 and discussed hereinabove, the sheet resistance of a needle-shape Ru film (formed at a high chamber pressure and with a large oxygen flow rate) is high and the sheet resistance of a rock-shape Ru film (formed at a low chamber pressure and with a small oxygen flow rate) is low. Although a Ru film formed by changing process conditions during CVD is not illustrated in FIG. 12, the sheet resistance of a Ru film so formed, according to embodiments of the present invention described hereinabove, has been measured to be less than or equal to 20 $\mu\Omega$·cm.

Figure 13:
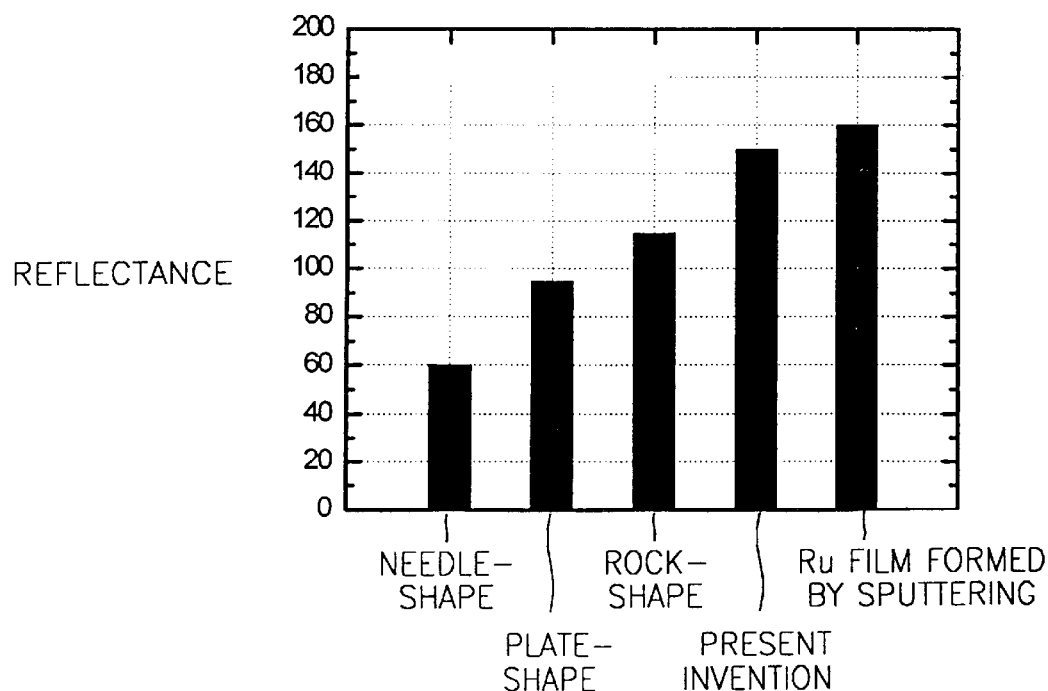
FIG. 13 is a graph that illustrates the reflectances of Ru films formed by CVD under various process conditions and by sputtering.

FIG. 13 is a graph that illustrates reflectances of Ru films formed by CVD under various process conditions and by sputtering. Reflectance is generally indicative of surface morphology (i.e., the roughness of the surface). In FIG. 13, the reflectance of each Ru film is expressed as a relative value to the reflectance of a silicon surface, which is set to 100. As illustrated in FIG. 13, the surface of a needle-shape Ru film is roughest, the surface of a Ru film deposited by sputtering is smoothest, and the smoothness of the surface of a Ru film that is formed by CVD in two steps, according embodiments of the present invention, is similar to that of the Ru film formed by sputtering.

The step coverage of Ru films formed by changing process conditions during CVD in accordance with embodiments of the present invention has also been experimentally measured. Specifically, a Ru film has been formed on a silicon oxide film having a trench formed therein at a depth of about 1 $\mu$m using a two-step CVD process according to embodiments of the present invention. A Ru film has also been formed on a tantalum oxide (Ta$_2$O$_5$) film having a trench formed therein at a depth of about 1 $\mu$m using a two-step CVD process according to embodiments of the present invention. The step coverage of the two aforementioned Ru films was measured and was found to be about 70–90%, which is a generally good result. It was found that better step coverage may be obtained when the temperature in the second CVD step is higher than the temperature in the first CVD step.

Figure 14A:
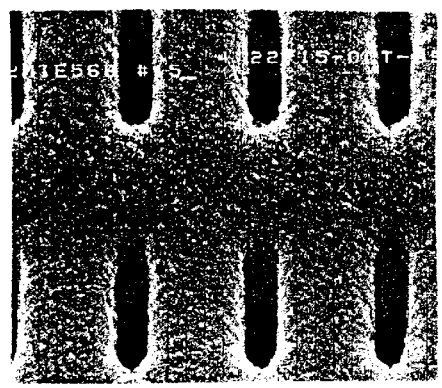
FIGS. 14A and 14B are photographs taken by a SEM of the surface and a section of a Ru film formed by CVD in accordance with embodiments of the present invention.
Figure 14B:
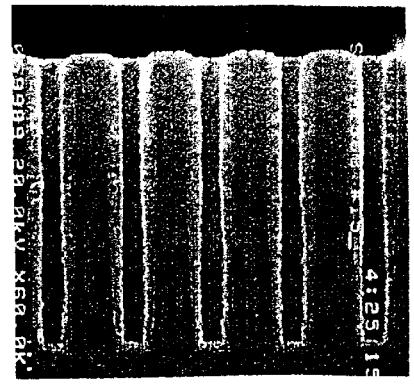

FIGS. 14A and 14B are photographs taken by a SEM of the surface and a section of a Ru film, respectively, which was formed on a tantalum oxide film under the following conditions in accordance with embodiments of the present invention:

Chamber pressure: 19 Torr (first step); 1 Torr (second step)

Oxygen flow rate: 750 sccm (first step); 100 sccm (second step)

Substrate temperature: 315° C. (first step); 330° C. (second step)

Deposition time: 1 minute (first step); 3 minutes (second step)

As illustrated in FIGS. 14A and 14B, a Ru film formed in accordance with embodiments of the present invention may be uniformly deposited.

A Ru film formed by CVD typically includes small amounts of carbon, which is contained in the ruthenium source gas, and oxygen, which is provided as a reactant gas, as impurities. Impurities may deteriorate the electrical characteristics of a Ru film. For example, carbon generally increases the resistance of a Ru film. Therefore, it is preferable that the amount of impurities contained in a Ru film is kept low.

In accordance with further embodiments of the present invention, heat treatment may be performed in an oxygen or ozone atmosphere to improve the electrical characteristics of a Ru film. When depositing a Ru film in two steps as described hereinabove with respect to blocks S110 or S130 of FIG. 6, heat treatment is performed at a pressure of about 1–100 Torr and a temperature of about 240°–450° C. in an oxygen or ozone atmosphere, in-situ or ex-situ, after the first deposition step at block S120 and/or after the second deposition step at block S140. The heat treatment may improve the electrical characteristics of the Ru film by removing the carbon impurities contained therein. An inert gas, such as argon or nitrogen, may be supplied during the heat treatment.

Figure 15:
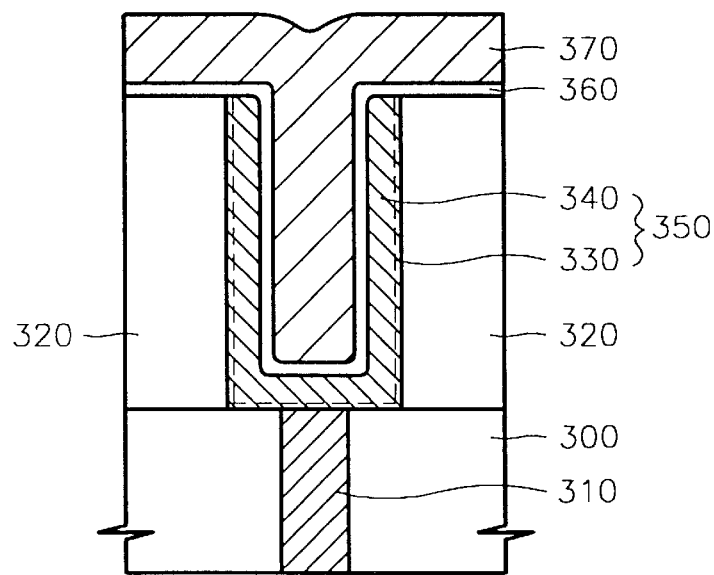
FIG. 15 is a sectional view of a capacitor having an electrode that comprises an Ru film formed by CVD in accordance with embodiments of the present invention.

FIG. 15 is a sectional view of a capacitor having an electrode that comprises an Ru film formed by CVD in accordance with embodiments of the present invention. Referring now to FIG. 15, a lower electrode contact plug 310 is formed in a substrate or interlayer dielectric layer 300. Next, an interlayer dielectric layer 320 having an opening that exposes the lower electrode contact plug 310 is formed.

Subsequently, a Ru film 350 for a lower electrode is formed on the entire surface of the resultant structure by changing process conditions during CVD in accordance with embodiments of the present invention discussed hereinabove. For example, in an initial step, a Ru film portion 330 is deposited under conditions that cause the nucleation rate to be faster than the growth rate (i.e., conditions that facilitate a relatively smooth surface morphology). In a succeeding step, a Ru film portion 340 is deposited under conditions that cause the growth rate to be faster than the nucleation rate (i.e., conditions that facilitate uniform growth in multiple directions) until the Ru film 350 reaches a desired thickness. The entire surface of the resultant structure may then be chemical mechanical polished, for example, to remove the Ru film 340 deposited on the top surface of the interlayer dielectric layer 320 and to expose the interlayer dielectric layer 320, thereby separating the lower electrode 350 from adjacent lower electrodes.

Thereafter, a dielectric film 360 is formed on the entire surface of the resultant structure. Although not shown, the dielectric film 360 may be formed after removing the interlayer dielectric layer 320 and exposing the outer wall of the cylinder-type lower electrode 350. This can enlarge the effective area of the electrode. The dielectric film 360 preferably comprises a ferroelectric material, such as BST or PZT, or a material with a high dielectric constant, such as Ta$_2$O$_5$.

Next, an upper electrode 370 is formed on the entire surface of the dielectric film 360. Like the lower electrode 350, the upper electrode 370 may comprise a Ru film and may be formed by changing process conditions during CVD in accordance with embodiments of the present invention described hereinabove. Besides Ru, the upper electrode 370 may comprise impurity doped polysilicon, another noble metal, such as platinum, iridium, or the oxidized material thereof, or another conductive metal compound, such as TiN or TiSiN. In further embodiments of the present invention, the lower electrode 350 may comprise a conductive material other than a Ru film formed in accordance with the present invention, and the upper electrode 370 may comprise a Ru film formed by changing process conditions during CVD.

In addition, when forming the lower electrode 350 and/or the upper electrode 370 by a two-step CVD methodology in accordance with embodiments of the present invention discussed hereinabove, heat treatment may be performed in an oxygen or ozone atmosphere between the first and second deposition steps of the Ru film or after the second deposition step. Moreover, when the dielectric film 360 comprises a ferroelectric material or a material with a high dielectric constant, heat treatment for crystallization of the dielectric film 360 material may be performed after forming the dielectric film 360 or after forming the upper electrode 370.

Although a cylinder type lower electrode has been described herein for purposes of illustration, the lower electrode of the capacitor may be any type, such as a simple stack type or a pin type, when the lower and/or upper electrode comprises a Ru film that is formed by changing process conditions during a CVD process in accordance with embodiments of the present invention.

Although particular process conditions are recited herein in describing methods of forming a Ru film according to embodiments of the present invention, it will be understood that specific numerical values for the various CVD conditions (i.e., CVD chamber pressure, oxygen flow rate, and substrate temperature) may vary depending on equipment or the fabrication environment. For example, an oxygen flow rate may go beyond an exemplified range depending on the size of the deposition chamber. It is understood that the skilled artisan can select proper numerical values for the CVD process conditions based on a particular environment without departing from the spirit of the present invention, in which first Ru film deposition conditions are selected to allow a nucleation rate to be faster than a growth rate and second Ru film deposition conditions are selected to allow the growth rate to be faster than the nucleation rate.

From the foregoing it can readily be seen that the present invention may be used to form a Ru film by changing process conditions during CVD so as to cause the nucleation rate to be faster than the growth rate in an initial stage and under conditions that cause the growth rate to be faster than the nucleation rate in a later stage. Advantageously, a Ru film having a combination of good step coverage, surface morphology, and electrical characteristics may be obtained.

In addition, the present invention may be used to form lower and/or upper electrodes out of a Ru film for a capacitor having a three-dimensional shape, such as a cylinder shape or a pin shape, so as to provide improved step coverage, which is typically not provided by conventional sputtering methodologies. Moreover, the electrical characteristics of the Ru film electrodes formed by changing process conditions during CVD are generally comparable to the Ru film electrodes formed by conventional sputtering techniques.

Another potential drawback with conventional technology is that a dielectric film comprising a ferroelectric material or a material with a high dielectric constant may deteriorate due to hydrogen passing through an upper electrode during the process of forming an intermetal dielectric layer, a metal wire, and a passivation layer in a hydrogen atmosphere after the formation of a capacitor. Advantageously, it has been found that deterioration of a dielectric film due to penetration of hydrogen may be reduced when a Ru film that is formed by changing process conditions during CVD is used as an upper electrode.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of forming a ruthenium film, comprising the steps of:
    reacting a ruthenium source gas and oxygen at a first pressure and at a first oxygen gas flow rate to deposit ruthenium on a substrate; and
    reacting the ruthenium source gas and oxygen at a second pressure and at a second oxygen gas flow rate to deposit ruthenium on the substrate, wherein at least one of the second pressure and the second oxygen gas flow rate is less than the first pressure and the first oxygen gas flow rate, respectively.

2. A method as recited in claim 1, wherein the first pressure is in a range from about 10 Torr to 50 Torr.

3. A method as recited in claim 1, wherein the second pressure is in a range from about 0.05 Torr to 10 Torr.

4. A method as recited in claim 1, wherein the first oxygen gas flow rate is in a range from about 500 sccm to 2000 sccm.

5. A method as recited in claim 1, wherein the second oxygen gas flow rate is in a range from about 10 sccm to 300 sccm.

6. A method as recited in claim 1, wherein a substrate temperature is in a range from about 250° C. to 450° C.

7. A method as recited in claim 6, wherein the substrate temperature is about 10° C. to about 30° C. higher when performing the step of reacting the ruthenium source gas and oxygen at the second pressure and at the second oxygen gas flow rate than the substrate temperature is when performing the step of reacting the ruthenium source gas and oxygen at the first pressure and at the first oxygen gas flow rate.

8. A method as recited in claim 1, further comprising the step of:
    heating the deposited ruthenium at a temperature in a range from about 250° C. to 450° C. in an atmosphere that comprises a gas selected from the group consisting of oxygen and ozone after the step of reacting the ruthenium source gas and oxygen at the first pressure and at the first oxygen gas flow rate.

9. A method as recited in claim 8, wherein the step of heating the deposited ruthenium at the temperature in the range from about 250° C. to 450° C. in the atmosphere that comprises the gas selected from the group consisting of oxygen and ozone comprises the step of:
    heating the deposited ruthenium at the temperature in the range from about 250° C. to 450° C. in the atmosphere that comprises the gas selected from the group consisting of oxygen and ozone at a CVD chamber pressure in a range from about 1 to 100 Torr.

10. A method as recited in claim 1, further comprising the step of:
    heating the deposited ruthenium at a temperature in a range from about 250° C. to 450° C. in an atmosphere that comprises a gas selected from the group consisting of oxygen and ozone after the steps of reacting the ruthenium source gas and oxygen at the first pressure and at the first oxygen gas flow rate and reacting the ruthenium source gas and oxygen at the second pressure and at the second oxygen gas flow rate.

11. A method as recited in claim 10, wherein the step of heating the deposited ruthenium at the temperature in the range from about 250° C. to 450° C. in the atmosphere that comprises the gas selected from the group consisting of oxygen and ozone comprises the step of:
    heating the deposited ruthenium at the temperature in the range from about 250° C. to 450° C. in the atmosphere that comprises the gas selected from the group consisting of oxygen and ozone at a CVD chamber pressure in a range from about 1 to 100 Torr.

12. A method as recited in claim 1, wherein the ruthenium source gas is selected from the group consisting of vaporized $Ru(C_2H_5C_5H_4)_2$ (Bis(EthylCyclopentadienyl) Ruthenium), $Ru(C_{11}H_{10}O_2)_3$ (Tris(DiPivaloylMetanate) Ruthenium), $Ru(C_5H_5)_2$ (Bis(Cyclopentadienyl) Ruthenium), and $Ru(CH_3CH_2CH_2CH_2CH_3C_5H_3)_3$ (Tris(2,4-OctaneDionato) Ruthenium).

13. A method of forming a ruthenium film, comprising the steps of:
   reacting a ruthenium source gas and oxygen to deposit ruthenium on a substrate; and
   changing at least one of a pressure, an oxygen gas flow rate, and a substrate temperature during the step of reacting the ruthenium source gas and oxygen.

14. A method as recited in claim 13, wherein the step of changing at least one of the pressure, the oxygen gas flow rate, and the substrate temperature comprises the step of:
   decreasing the pressure from a range of about 10 to 50 Torr to a range of about 0.05 to 10 Torr.

15. A method as recited in claim 13, wherein the step of changing at least one of the pressure, the oxygen gas flow rate, and the substrate temperature comprises the step of:
   decreasing the oxygen gas flow rate from a range of about 500 to 2000 sccm to a range of about 10 to 300 sccm.

16. A method as recited in claim 13, wherein the step of changing at least one of the pressure, the oxygen gas flow rate, and the substrate temperature comprises the step of:
   increasing the substrate temperature by an amount ranging from about 10° C. to 30° C. while maintaining the substrate temperature in a range from about 250° C. to 450° C.

17. A method as recited in claim 13, wherein the ruthenium source gas is selected from the group consisting of vaporized $Ru(C_2H_5C_5H_4)_2$ (Bis(EthylCyclopentadienyl) Ruthenium), $Ru(C_{11}H_{10}O_2)_3$ (Tris(DiPivaloylMetanate) Ruthenium), $Ru(C_5H_5)_2$ (Bis(Cyclopentadienyl) Ruthenium), and $Ru(CH_3CH_2CH_2CH_2CH_3C_5H_3)_3$ (Tris(2,4-OctaneDionato) Ruthenium).

18. A method of forming a ruthenium film, comprising the steps of:
   forming the ruthenium film on a substrate such that the ruthenium nucleation rate is greater than the ruthenium growth rate; and
   forming the ruthenium film on the substrate such that the ruthenium growth rate is greater than the ruthenium nucleation rate.

19. A method as recited in claim 18, further comprising the step of:
   heating the ruthenium film at a temperature in a range from about 250° C. to 450° C. in an atmosphere that comprises a gas selected from the group consisting of oxygen and ozone after the step of forming the ruthenium film on the substrate such that the ruthenium nucleation rate is greater than the ruthenium growth rate.

20. A method as recited in claim 19, wherein the step of heating the ruthenium film at the temperature in the range from about 250° C. to 450° C. in the atmosphere that comprises the gas selected from the group consisting of oxygen and ozone comprises the step of:
   heating the ruthenium film at the temperature in the range from about 250° C. to 450° C. in the atmosphere that comprises the gas selected from the group consisting of oxygen and ozone at a pressure in a range from about 1 to 100 Torr.

21. A method as recited in claim 18, further comprising the step of: heating the ruthenium film at a temperature in a range from about 250° C. to 450° C. in an atmosphere that comprises a gas selected from the group consisting of oxygen and ozone after the steps of forming the ruthenium film on the substrate such that the ruthenium nucleation rate is greater than the ruthenium growth rate and forming the ruthenium film on the substrate such that the ruthenium growth rate is greater than the ruthenium nucleation rate.

22. A method as recited in claim 21, wherein the step of heating the ruthenium film at the temperature in the range from about 250° C. to 450° C. in the atmosphere that comprises the gas selected from the group consisting of oxygen and ozone comprises the step of:
   heating the ruthenium film at the temperature in the range from about 250° C. to 450° C. in the atmosphere that comprises the gas selected from the group consisting of oxygen and ozone at a pressure in a range from about 1 to 100 Torr.

23. A method of forming an integrated circuit device, comprising the steps of:
   forming a lower electrode on a substrate;
   forming a dielectric layer on the lower electrode; and
   forming an upper electrode on the dielectric layer;
   wherein at least one of the lower electrode and the upper electrode comprises a ruthenium film formed by the following steps:
      forming the ruthenium film by chemical vapor deposition (CVD) using a ruthenium source gas and oxygen as a reactant gas at a first CVD chamber pressure and at a first oxygen gas flow rate; and
      forming the ruthenium film by CVD using the ruthenium source gas and oxygen as the reactant gas at a second CVD chamber pressure and at a second oxygen gas flow rate, wherein at least one of the second CVD chamber pressure and the second oxygen gas flow rate is less than the first CVD chamber pressure and the first oxygen gas flow rate, respectively.

24. A method of forming an integrated circuit device, comprising the steps of:
   forming a lower electrode on a substrate;
   forming a dielectric layer on the lower electrode; and
   forming an upper electrode on the dielectric layer;
   wherein at least one of the lower electrode and the upper electrode comprises a ruthenium film formed by the following steps:
      forming the ruthenium film by chemical vapor deposition (CVD) using a ruthenium source gas and oxygen as a reactant gas; and
      changing at least one of a CVD chamber pressure, an oxygen gas flow rate, and the substrate temperature during the step of forming the ruthenium film.

25. A method of forming an integrated circuit device, comprising the steps of:
   forming a lower electrode on a substrate;
   forming a dielectric layer on the lower electrode; and
   forming an upper electrode on the dielectric layer;
   wherein at least one of the lower electrode and the upper electrode comprises a ruthenium film formed by the following steps:
      forming the ruthenium film on a substrate such that the ruthenium nucleation rate is greater than the ruthenium growth rate; and
      forming the ruthenium film on the substrate such that the ruthenium growth rate is greater than the ruthenium nucleation rate.

* * * * *